United States Patent [19]
Kwak et al.

[11] Patent Number: 5,390,150
[45] Date of Patent: Feb. 14, 1995

[54] SEMICONDUCTOR MEMORY DEVICE WITH REDUNDANCY STRUCTURE SUPPRESSING POWER CONSUMPTION

[75] Inventors: Choong-Keun Kwak, Songpa-ku; Seung-Keun Lee, Joonglang-ku, both of Rep. of Korea

[73] Assignee: Samsung Electronics Co., Ltd., Kyungki-do, Rep. of Korea

[21] Appl. No.: 934,918

[22] Filed: Aug. 25, 1992

[30] Foreign Application Priority Data

Apr. 24, 1992 [KR] Rep. of Korea ............... 1992-6956

[51] Int. Cl.⁶ .............................................. G11C 13/00
[52] U.S. Cl. .................................... 365/227; 365/154; 365/200
[58] Field of Search ............... 365/200, 210, 226, 227, 365/96, 154

[56] References Cited

U.S. PATENT DOCUMENTS 5,134,585  7/1992  Murakami ........................ 365/200

Primary Examiner—Terrell W. Fears
Attorney, Agent, or Firm—Hecker & Harriman

[57] ABSTRACT

A semiconductor memory device with a redundancy circuit comprising fuses for selectively blocking the supply of the power voltage to the bit line pair, in order to minimize the power consumption originated from the contacting of the bit line to ground caused by a processing failure on the bit lines in stand-by state even though a column replacement is performed.

8 Claims, 3 Drawing Sheets

SEMICONDUCTOR MEMORY DEVICE WITH REDUNDANCY STRUCTURE SUPPRESSING POWER CONSUMPTION

BACKGROUND OF THE INVENTION

1. Field of the Invention

The present invention relates to a semiconductor memory device, and more particularly to a semiconductor memory device with a redundancy circuit.

2. Background Art

The shrinkage of unit cells has accelerated with the high density of semiconductor memory devices, thus cutting down on the yield rate for good chips. Therefore, recent semiconductor memory devices usually employ a redundancy circuit with a spare cell for replacing a defective cell. The semiconductor memory device with the redundancy circuit has a normal decoder connected to a normal word line-and a redundant decoder connected to a redundant word line. The normal decoder receives the shaped row address and the redundant decoder senses the state of the memory cell to provide a sense signal indicative of the normal mode or redundancy mode, thereby selecting the normal word line or the redundant word line. An output of the column decoder selectively turns off or on a column select transistor, transmitting the information from a given cell that is driven and selected by the word lines to an input/output gate connected to the cell.

The conventional redundancy circuit of FIG. 1 is disclosed in U.S. Pat. No. 4,780,851, which was granted to Osama Kurakami.

In normal mode operation, the row decoder selects a word line, and the column decoder 19 selects the given bit line pair, accessing the information in the memory cell. The column select transistor is turned on to transfer data from the memory cell of the main memory array to the input/output gate. On the other hand, in redundancy mode operation, an output Yi of the column decoder 19 asserts a logical "high," turning off the column select transistors NP1, NP2, NP3 and NP4. Accordingly, the information of the column with the defective memory cell is not delivered to the input/output gate connected to the column select transistors. That is, access of the column with the defective memory cell is suppressed. Thereafter, the normal cell of the redundancy memory array replaces the defective cell of the main memory array. The information in the accessed normal cell is transferred to the input/output gate performing the data reading and writing operation. If a defective cell of a static random access memory (SRAM) connected to the word line is found, the replacement operation of the redundancy circuit is started.

However, when the defect is detected at point A, B or C, even though the defective memory cell in the main memory array is replaced with the good memory cell in the redundancy memory array, the power consumption caused by the defect at A, B or C is effectively not prevented. Accordingly, programming lines, such as fuses 11 and 12, are disposed at the respective row of the main memory array so that the power voltage V cc is selectively supplied to the memory cell, wherein the redundant memory array is the same structure as shown in FIG. 1. In normal mode, the ground voltage GND or power voltage Vcc is supplied through fuse 11 or 12 of the main memory array, and the fuse of the redundancy memory array is selectively cut according to the respective case. In redundant mode, the voltage supply to the main memory array is blocked by cutting fuse 11 or 12 of the main memory cell array so as to prevent the power consumption caused by the defective cell of the main memory array.

On the other hand, in the case of column replacement, transistors N1 and N2, connected to the bit lines, are turned on by a logical "low" voltage (ground) upon enabling of the chip, and PMOS transistors N3 and N4 (for suppressing the leakage current of the bit lines) are turned on, raising the bit lines to Vcc level. Here, if a current path, which is caused by a defect of the bit line pair during processing, is formed between the bit line and ground voltage, even though the column replacement is carried out, a leakage current through the precharging transistors and clamping transistors is generated from the voltage level to ground level.

SUMMARY OF THE PRESENT INVENTION

It is an object of the present invention to provide a semiconductor memory device with a redundancy circuit capable of decreasing power consumption generated at stand-by state in case of column replacement.

It is another object of the invention to provide a semiconductor memory device suitable for layout, satisfying high density while decreasing power consumption.

Achieving the objects of the invention, a power voltage is connected with cutting means, such as fuses, for selectively controlling the supply of the power voltage to the bit line pairs.

BRIEF DESCRIPTION OF THE DRAWINGS

For a better understanding of the invention, and to show how the same may be carried into effect, reference will now be made, by way of example, to the accompanying diagrammatic drawings, in which.

DETAILED DESCRIPTION OF THE PRESENT INVENTION

Figure 1:
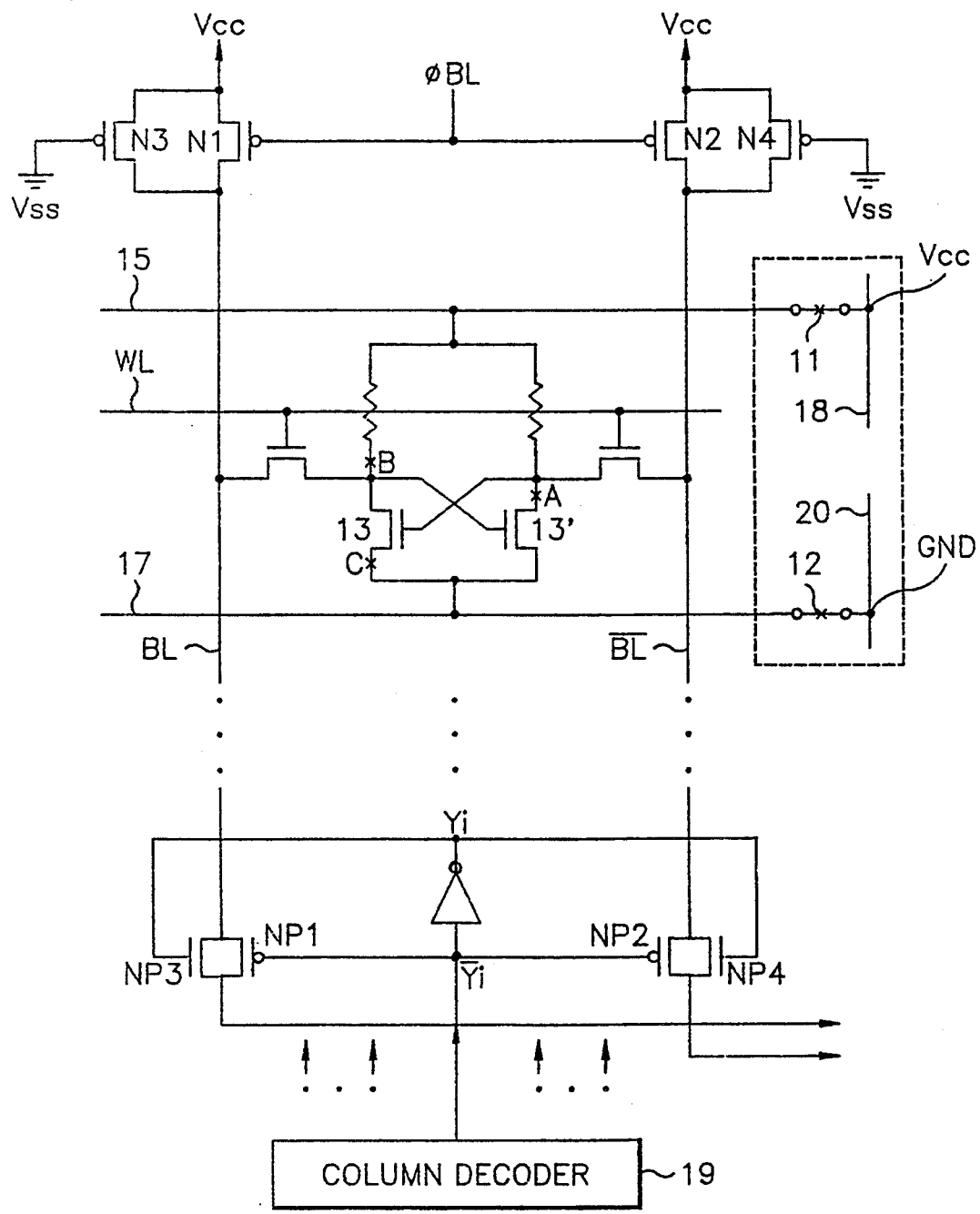
FIG. 1 is a part of a semiconductor memory device with the redundancy structure of the prior art.
Figure 2:
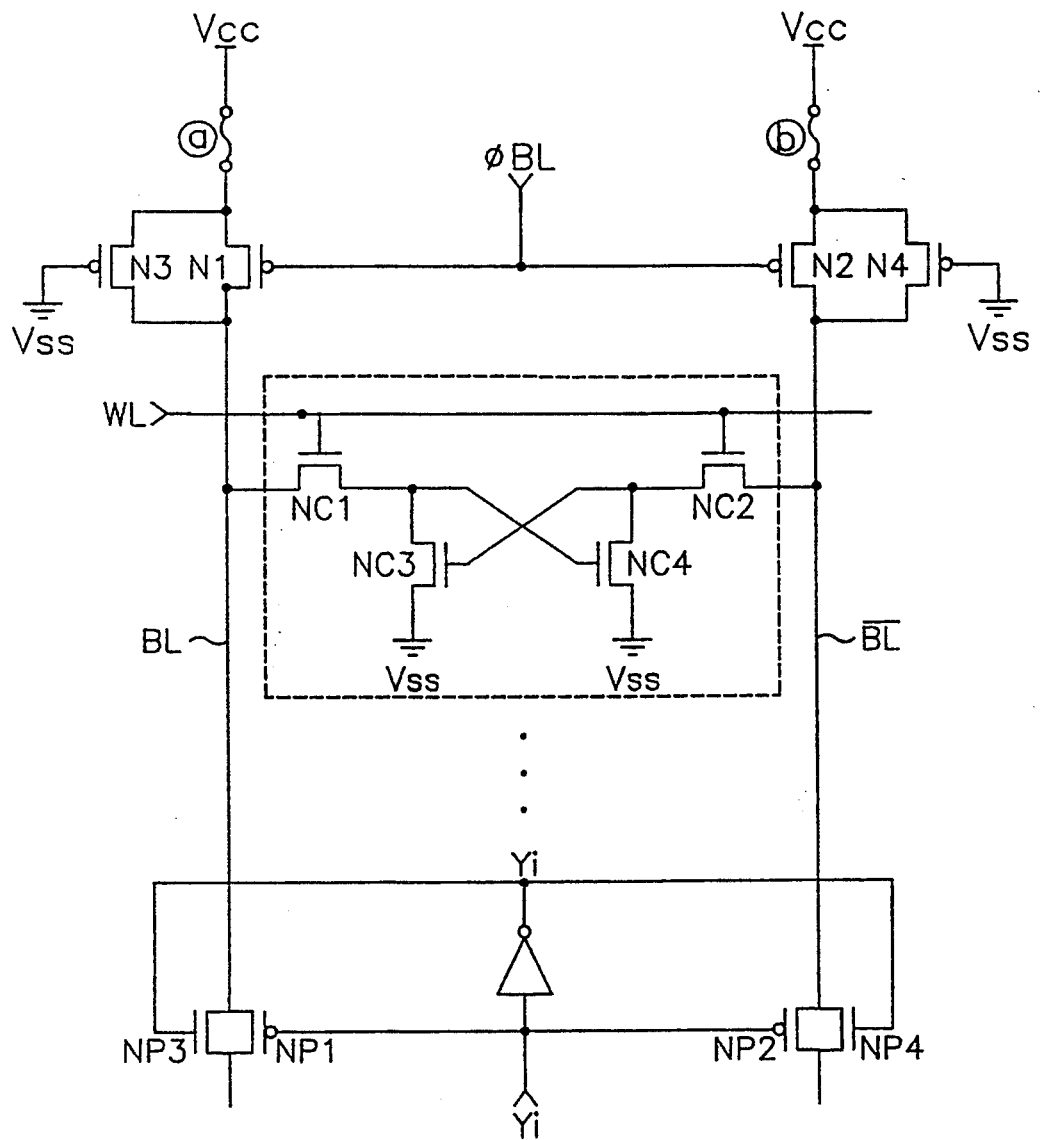
FIG. 2 is a part of a semiconductor memory device according to the present invention.

Referring to FIG. 2, the difference between the structure of FIGS. 1 and 2 is located in fuses. Fuses A and B, serving as cutting means, are connected between the power voltage and precharging transistors N1 and N2, and clamping transistors N3 and N4.

In stand-by state, signal ØBL is at a logical "low," and thus turns on precharging transistors N1 and N2. The clamping transistors are turned on by the ground voltage. Fuses "A" and "B" control transmitting of power voltage Vcc to transistors N1, N2, N3 and N4. Therefore, the operative connection between the power voltage and the bit lines is blocked by disconnecting fuses "A" and "B" in stand-by state, regardless of a defective cell. Accordingly, when a defect caused by the processing of the transistors is detected, the cutting of the fuse allows the power consumption to be drastically decreased. Of course, in the case where the clamping transistors and precharging transistors are not part of a defective cell, it is not necessary to cut the fuse.

Figure 3:
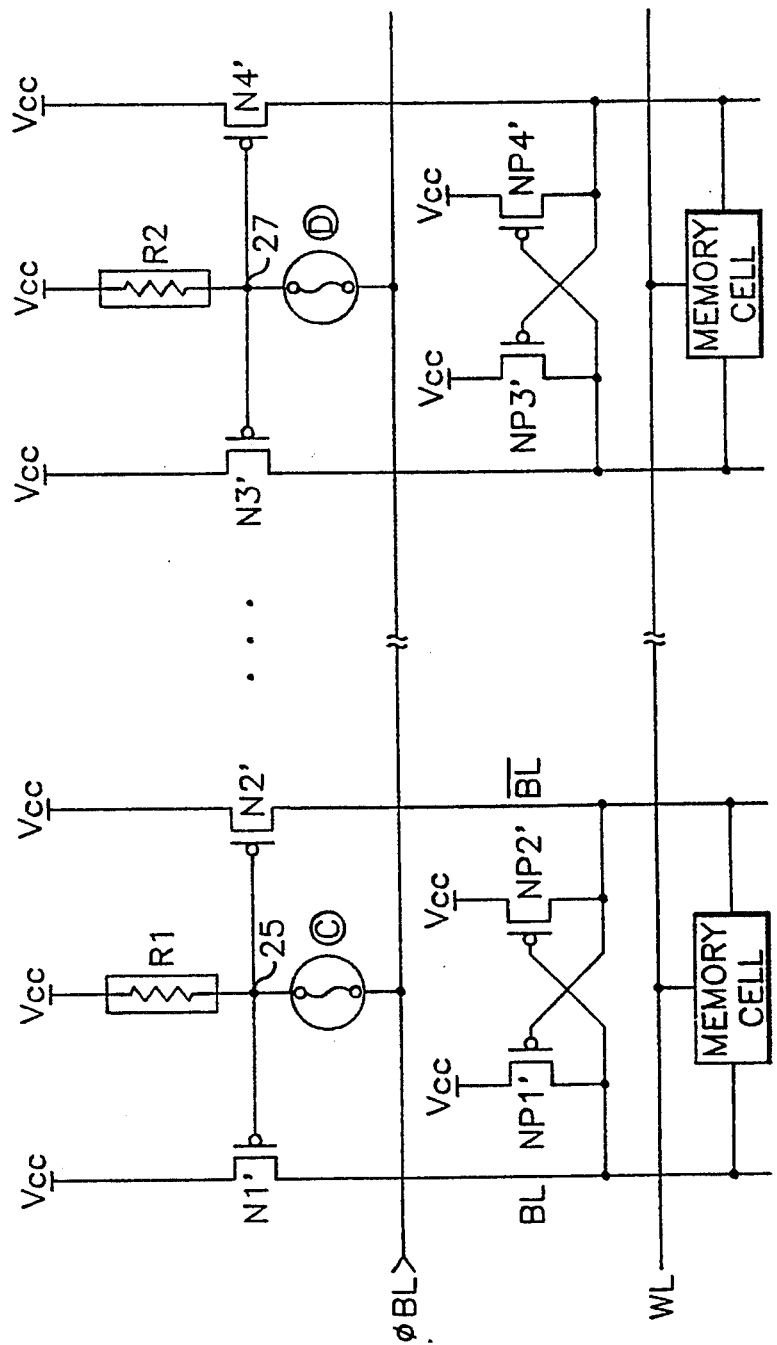
FIG. 3 is another embodiment according to the present invention.

Referring to FIG. 3, illustrating another embodiment of the present invention, each precharging transistor is comprised of two PMOS transistors N1' and N2' (N3' and N4') and high resistance R1 (R2). Each clamping transistor for preventing the leakage of the bit lines is comprised of two PMOS transistors NP1' and NP2' (NP3' and NP4').

While fuse "A" of FIG. 2 is directly connected to the power voltage Vcc, fuse "C" of FIG. 3 is connected between the signal ØBL and the high resistance R1. Resistor R1 is connected to the power voltage Vcc. The potential of node 25, between fuse "C" and resistor R1, is applied to the gates of PMOS transistors N1' and N2'. In stand-by state, the signal ØBL is at logical "low," and fuse "C" is cut. Node 25 asserts logical "high," and PMOS transistors N1' and N2' are turned off. Accordingly, the possible potential transition from the power voltage to the ground voltage is prevented. Whereas in FIG. 2, a pair of clamping transistors, N3' and N4', are connected to the bit line pair. A channel of each clamping transistor NP1' and NP2' of FIG. 3 is connected between the bit line pair, BL and $\overline{BL}$, and power voltage Vcc. If the bit line BL is at logical "low" (complementary bit line $\overline{BL}$ is at logical "high"), transistor NP2' is turned on, and transistor NP1' is turned off. Thus, the potential change from the power voltage to the ground voltage through the transistor NP1 is not generated. That is, the potential of bit lines BL and $\overline{BL}$ is maintained, suppressing the power consumption.

As described above, in replacing the column, the power consumption generated by the connection of bit lines to the power voltage in stand-by state is effectively averted. In particular, the leakage from the clamping and precharging transistors disposed on the bit lines is prevented. In addition, because the above effect is achieved by simple fuse means, the present invention is advantageous to high density memory devices.

Although the description of the present invention has been limited to the power consumption generated at bit lines after column replacement, it will be apparent to those who are skilled in the art that the circuit of the present invention may be used regardless of the defective cell; and further, the power consumption caused by another element, excepting the clamping and precharging transistors, can be effectively suppressed.

While the invention has been particularly shown and described with reference to the preferred specific embodiment thereof, it will be apparent to those who are skilled in the art that, in the foregoing, changes in form and detail may be made without departing from the spirit and scope of the present invention.

We claim:

1. A semiconductor memory device having a number of divided memory blocks, comprising:
   first memory means receiving a row address for driving a given word line belonging to a given memory block;
   second means receiving a column address for driving a given pair of bit lines among a plurality of bit line pairs connected to the driven word line;
   means for maintaining and transmitting information in a memory cell accessed by said driven word line and bit line pair in accordance with a control signal;
   blocking means for blocking supply of a power voltage to said bit line pair when maintaining said information, said blocking means comprising at least one fuse connected to said power voltage;
   a first transistor pair having channels connected between said bit line pair and said fuse and selectively operating in response to a given pulse;
   a resistance connected between said power voltage and one terminal of said fuse, another terminal of said fuse being connected to receive said pulse;
   a second transistor pair having gates connected with a node formed by said resistance and said fuse and channels, one terminal of said channel being connected to said power voltage.

2. A semiconductor memory device as claimed in claim 1, further comprising a third transistor pair having channels between said power voltage and a first and second bit line of said bit line pair, and gates connected to said second and first bit line connected to said second transistor pair, respectively.

3. A semiconductor memory device having a number of divided memory blocks and a redundancy memory block, said divided memory blocks having at least one defective cell, said redundancy memory block having a spare cell replacing said defective cell, said device comprising:
   word line and bit line pairs connected to said spare cell;
   a first MOS transistor pair connected between said bit line pair and a power voltage for precharging a potential between said bit line pair; and
   control means for controlling transmitting of the power voltage level through said first MOS transistor pair to said bit line pair.

4. A semiconductor memory device as claimed in claim 3, wherein said control means comprises at least one fuse, whereby, when maintaining information in said spare cell, said fuse is electrically disconnected from said power voltage.

5. A semiconductor memory device as claimed in claim 3, further comprising a high resistance connected in series between said control means and said power voltage, a cross point formed by said high resistance and said control means being connected to gates of said first MOS transistor pair.

6. A semiconductor memory device as claimed in claim 4, further comprising a PMOS transistor pair having channels formed between a first and second bit line of said bit line pairs and said power voltage, and having gates connected to said second and first bit lines, respectively.

7. A semiconductor memory device as claimed in claim 5, further comprising a PMOS transistor pair having channels formed between a first and second bit line of said bit line pairs and said power voltage, and having gates connected to said second and first bit lines, respectively.

8. A semiconductor memory device having a number of divided memory blocks, comprising:
   first memory means receiving a row address for driving a given word line belonging to a given memory block;
   second means receiving a column address for driving a given pair of bit lines among a plurality of bit line pairs connected to the driven word line;
   means for maintaining and transmitting information in a memory cell accessed by said driven word line and bit line pair in accordance with a control signal;
   blocking means for blocking supply of a power voltage to said bit line pair when maintaining said information, said blocking means comprising at least one fuse connected to said power voltage;
   a first transistor pair having channels connected between said bit line pair and said fuse and selectively operating in response to a given pulse;
   a second transistor pair having channels connected between said fuse and said bit line pair, and having gates connected to a ground voltage.

* * * * *